(12) United States Patent
Xue et al.

(10) Patent No.: US 8,575,006 B2
(45) Date of Patent: Nov. 5, 2013

(54) PROCESS TO FORM SEMICONDUCTOR PACKAGES WITH EXTERNAL LEADS

(75) Inventors: Yan Xun Xue, Los Gatos, CA (US); Jun Lu, San Jose, CA (US)

(73) Assignee: Alpha and Omega Semiconducotr Incorporated, Sunnyvale, CA (US)

( * ) Notice: Subject to any disclaimer, the term of this patent is extended or adjusted under 35 U.S.C. 154(b) by 577 days.

(21) Appl. No.: 12/592,596

(22) Filed: Nov. 30, 2009

(65) Prior Publication Data

US 2011/0129961 A1 Jun. 2, 2011

(51) Int. Cl.
*H01L 31/00* (2006.01)

(52) U.S. Cl.
USPC .............................. 438/460; 438/461; 438/462

(58) Field of Classification Search
USPC .................................................. 438/460–462
See application file for complete search history.

(56) References Cited

U.S. PATENT DOCUMENTS

| | | |
|---|---|---|
| 2004/0178500 A1 | 9/2004 | Usui |
| 2007/0111393 A1 | 5/2007 | Burghout et al. |
| 2009/0298232 A1 * | 12/2009 | Burghout et al. ............. 438/113 |
| 2010/0187663 A1 * | 7/2010 | Celaya et al. ................. 257/666 |

FOREIGN PATENT DOCUMENTS

TW 97115985 4/2007

* cited by examiner

*Primary Examiner* — Jae Lee
(74) *Attorney, Agent, or Firm* — Bo-In Lin

(57) ABSTRACT

This invention discloses a process for packaging semiconductor device with external leads. The process includes comprises Step 1: providing a lead frame comprising a plurality of lead frame units connected by a plurality of metal beams, each lead frame unit comprising a die pad and a plurality of leads located on opposite sides of the die pad; adhering a semiconductor chip onto each of the die pad, and providing a plurality of metal connections for electrically connecting each chip to its corresponding leads; Step 2 providing a plastic molding material to enclose the plurality of the lead frame units, the metal beams, the chips, and at least portions of the metal connections; Step 3 removing a portion of the plastic molding material above the metal beams to expose the metal beams and portions of the leads in connection with the metal beams; and Step 4 separating each lead frame unit, forming a plurality of individual semiconductor plastic package components with external leads.

20 Claims, 14 Drawing Sheets

PROCESS TO FORM SEMICONDUCTOR PACKAGES WITH EXTERNAL LEADS

FIELD OF INVENTION

This invention generally relates to the field of semiconductor device package and packaging process. More particularly, the present invention is related to a semiconductor package configuration and manufacturing method by packaging the semiconductor components with external leads.

BACKGROUND OF THE INVENTION

The conventional technologies for packaging the semiconductor components are still faced with limitations due to the facts that the packaging processes require longer processing time and higher fabrication costs. The limitations of the conventional technologies can be illustrated by the processes of packaging the semiconductor components 3 with external leads 122 as shown in FIG. 1. The packaging processes include the following steps:

Step 1 Chip adhering: for each lead frame unit on a lead frame, a plurality of chips are respectively adhered to the die pads; in which the lead frame contains a plurality of lead frame units, and each lead frame unit contains die pads and a plurality of leads on both sides of the die pad; adjacent lead frame units are connected by connecting each lead to the metal beam;

Step 2 Wire connecting and bonding: for each lead frame unit, its chips and leads are connected respectively by metal wire bonding;

Step 3 Plastic packaging: carry out plastic packaging of the lead frame, sealing the chips, die pads and some leads in the plastic package; in this step, a plurality of plastic package cavities are formed for each lead frame unit, which are separated by a plurality of metal beams on the lead frame; after this step, each lead is divided into a internal portion sealed inside the plastic package, and a external portion outside the package, and each plastic package cavity unit is vertically and horizontally connected by the metal beams;

Step 4 Resin flush removal: during the plastic packaging, scraps will be left in the area at the edge of plastic package or among the external leads, so in this step the scraps formed at the edge of each plastic package cavity are removed;

Step 5 Sawing & separation: saw off the metal beams among plastic package cavities by impact extrusion, separate the connection among the leads of each lead frame unit, and in the meantime keep all the lead-external portions outside the package, thus forming a plurality of individual semiconductor component products with external leads.

However, the processes to package the semiconductor components with external leads as described above have the disadvantages typically encountered in the processes of plastic packaging that include resin flush removal and sawing and separation. For example, in the step of plastic packaging, it is necessary to form a plurality of plastic package cavities separated by the metal beams on the entire lead frame. Another example of such disadvantages occurs in the step of separation by impact extrusion. It is necessary to prepare unique punching tool according to plastic package cavities and their pitches in order to separate the lead frame units inside each plastic package array and thus finally form a plurality of individual semiconductor components. In order to meet these unique process operation requirements to process the packaging of electronic packages to contain different types of semiconductor components with external leads, it is necessary to separately design and manufacture the processing moulds or mechanical tools, etc. that meet and realize these process requirements, thus unavoidably resulting in longer preparation period and higher manufacturing cost of the entire process.

Therefore, it is necessary to provide a new and improved packaging process for semiconductor components with external leads to package the semiconductor components with more convenient processing steps to simplify the manufacturing processes and reduced the production costs such that the above discussed limitations and difficulties can be resolved. It is further desirable that the new and improved processing moulds or mechanical tools, etc. can be basically applicable to general packaging process and also applicable to different types of semiconductor packaging with external leads thus effectively improving the packaging efficiency, reducing the manufacturing cost, enhancing the product quality and productivity.

SUMMARY OF INVENTION

One aspect of this invention is to provide a process for packaging semiconductor components with external leads by applying standardized processing moulds and mechanical tools. These standard processing moulds and mechanical tools can be universally applicable to package electronic devices formed as semiconductor components with different external leads without additional design and without requiring to manufacture particular operating tools including moulds, thus effectively improving plastic packaging efficiency and reducing manufacturing cost.

In order to achieve the above goal, the embodiments of this invention disclose a process for semiconductor packaging with external leads, including the following steps:

Step 1: providing a lead frame comprising a plurality of lead frame units connected by a plurality of metal beams, each lead frame unit comprising a die pad and a plurality of leads located on opposite sides of the die pad; adhering a semiconductor chip onto each of the die pad, and providing a plurality of metal connections for electrically connecting each chip to its corresponding leads;

Step 2 providing a plastic molding material to enclose the plurality of the lead frame units, the metal beams, the chips, and at least portions of the metal connections;

Step 3 removing a portion of the plastic molding material above the metal beams to expose the metal beams and portions of the leads in connection with the metal beams;

Step 4 separating each lead frame unit, forming a plurality of individual semiconductor plastic package components with external leads.

Each lead located beside the die pad may contains an internal lead portion inside the plastic package with a lower surface exposed through the bottom of the plastic molding package and an external lead portion to be exposed outside the plastic package; In Step 2 the molding material may enclose the entire lead frame forming a plastic molding block; in Step 3 the removal of portion of molding material above the metal beams may include the process of sawing or laser blasting to form a plurality of molding material strips or blocks separated by the metal beams, with external lead portions exposed. The process in Step 3 further comprising: sawing the plastic package material vertically downward along the metal beam from the top surface of the entire plastic block down to the upper surface of the external lead portions using a first sawing tool with a first sawing width much wider than the metal beams therefore expose portions of the lead frame, including the entire metal beam and the external lead portion.

In one embodiment the separation of each lead frame unit in Step 4 further comprises sawing off the metal beam by a second sawing tool with a second sawing width narrower than first sawing width but slightly wider than the metal beam such that the lead connection to the metal beam is removed.

In one implementation method of this invention, the step of removal of a portion of the plastic molding material above the metal beam in Step 3 further comprises a step of forming a plurality of molding material strips separated by the metal beams and Step 4 further comprises the following steps:

Step 4.1: sawing off the metal beam between adjacent plastic mold strips to separate the connection between the leads of each lead frame unit, and keep the external portion of each lead;

Step 4.2 sawing between the lead frame units of plastic package strips, to separate and form a plurality of individual semiconductor components with external leads.

In another implementation method of this invention, the step of removal of a portion of the plastic molding material above the metal beam in Step 3 further comprises a step of forming a plurality of molding material strips separated by the metal beams and Step 4 further comprises the following steps:

Step 4.1 sawing between the lead frame units of plastic package strips across the metal beams with sections of metal beams connecting a plurality of lead frame units;

Step 4.2 sawing off the metal beams sections between adjacent lead frame units to separate the connection between the leads of each lead frame unit, and keep the external portion of each lead, forming a plurality of individual semiconductor components with external leads.

In one embodiment the external leads of adjacent leads are separately connected to the metal beam forming a space therein and the above process may further comprises a step 3.5 to remove the plastic package material filling the space between the external portions of adjacent leads by deflash or by laser blasting after Step 3; In another embodiment the external leads of adjacent leads are fused together and connected to the metal beam forming no space therein and the above process may further comprises a step 2.5 to remove the portion of metal between the external leads by masked etching or by laser cutting so that the external leads of adjacent leads are separated after package singulation.

The process for semiconductor packaging with external leads as provided in this invention has the following beneficial technical effects and advantages: the processing moulds and mechanical tools utilized in this method are applicable to common plastic packaging process and different types of lead-external semiconductor packaging processes, without additional design and manufacturing of particular operating tools including moulds, thus effectively improving plastic packaging efficiency and reducing manufacturing cost.

These and other objects and advantages of the present invention will no doubt become obvious to those of ordinary skill in the art after having read the following detailed description of the preferred embodiment, which is illustrated in the various drawing figures.

DESCRIPTION OF THE PREFERRED EMBODIMENTS

A detailed explanation of this invention is described below by reference to of FIG. 2~7, with selected embodiments as examples to illustrate the semiconductor packages according to the methods and configurations disclosed in this invention.

Implementation Example 1

FIGS. 2A~4 show a specific implementation example of the process for packaging semiconductor device with external leads provided in this invention, which forms semiconductor components with external leads for lead frames with the following structural characteristics.

Figure 1:
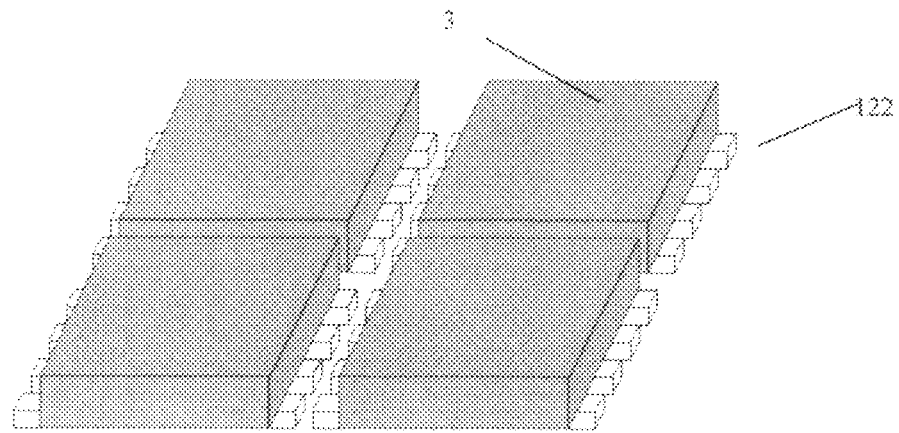
FIG. 1 is the structural diagram of semiconductor packaging with external leads in this invention.
Figure 2A:
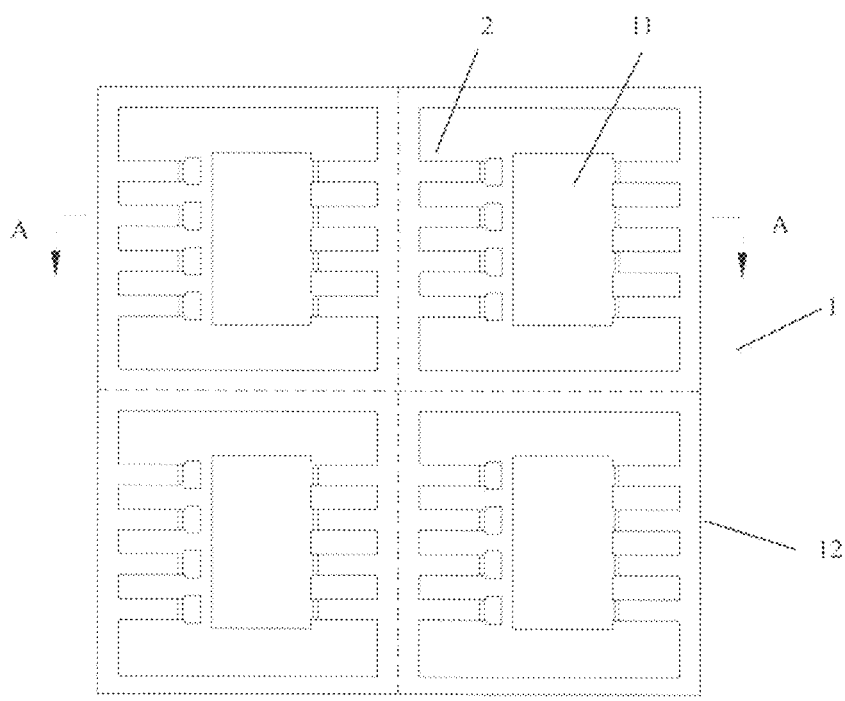
FIGS. 2A~2F is the top view of each step in the first specific implementation example of the process for semiconductor packaging with external leads in this invention.
Figure 3A:
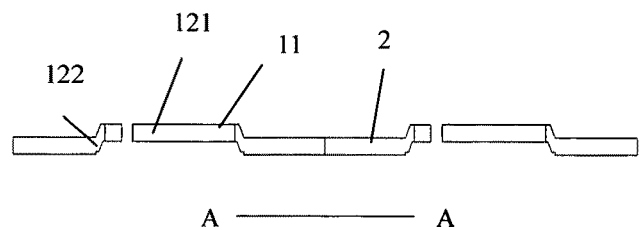
FIGS. 3A~3F is the cross sectional view of each step in the first specific implementation example of the process for semiconductor packaging with external leads in this invention.

As shown in FIG. 2A and FIG. 3A, the lead frame contains a plurality of distributed lead frame units 1, and metal beams 2 for connecting the lead frame units. In order to clearly and concisely show the structure of the lead frame, the lead frame containing 4 lead frame units (surrounded by broken lines in FIG. 2A) is taken as an example in this implementation example. Wherein, each lead frame unit 1 contains a die pad 11, and a plurality of leads 12 on both sides of the die pad 11; each lead contains an internal portion 121 to be sealed inside a plastic package and an external portion 122 to be exposed outside the plastic package. The external lead portions 122 of adjacent leads are separated with a space therein. Furthermore, the adjacent lead frame units 1 are connected by connecting the external portions 122 of each leads 12 to the metal beams 2.

Figure 2B:
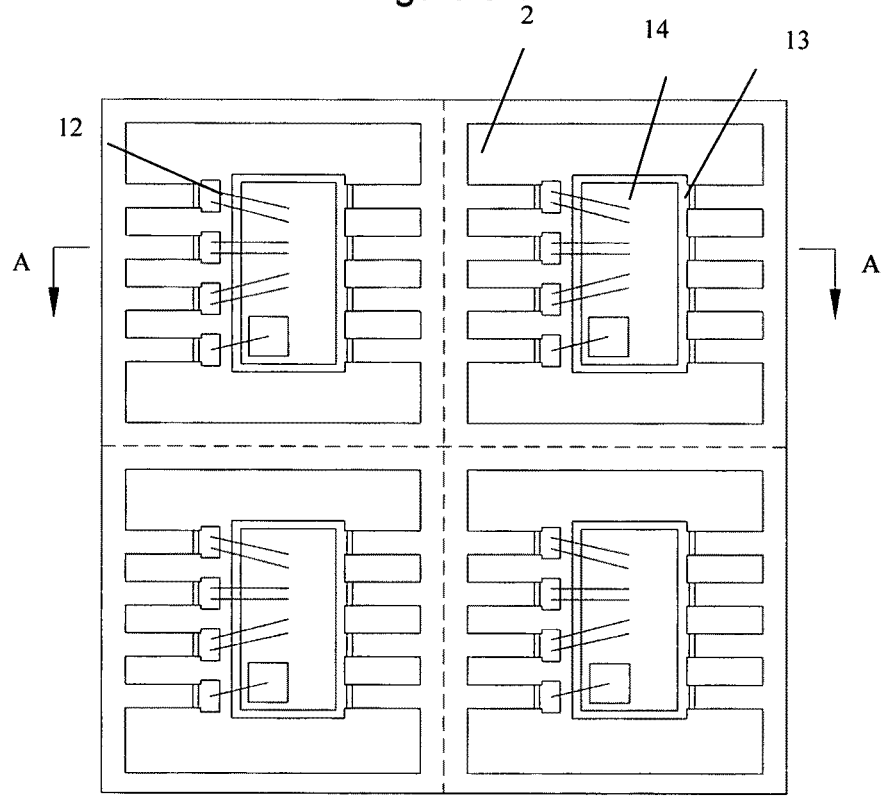
Figure 3B:
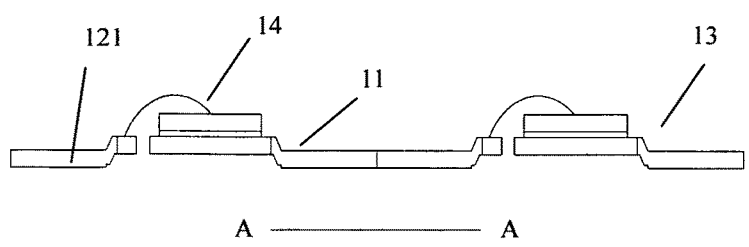
Figure 4:
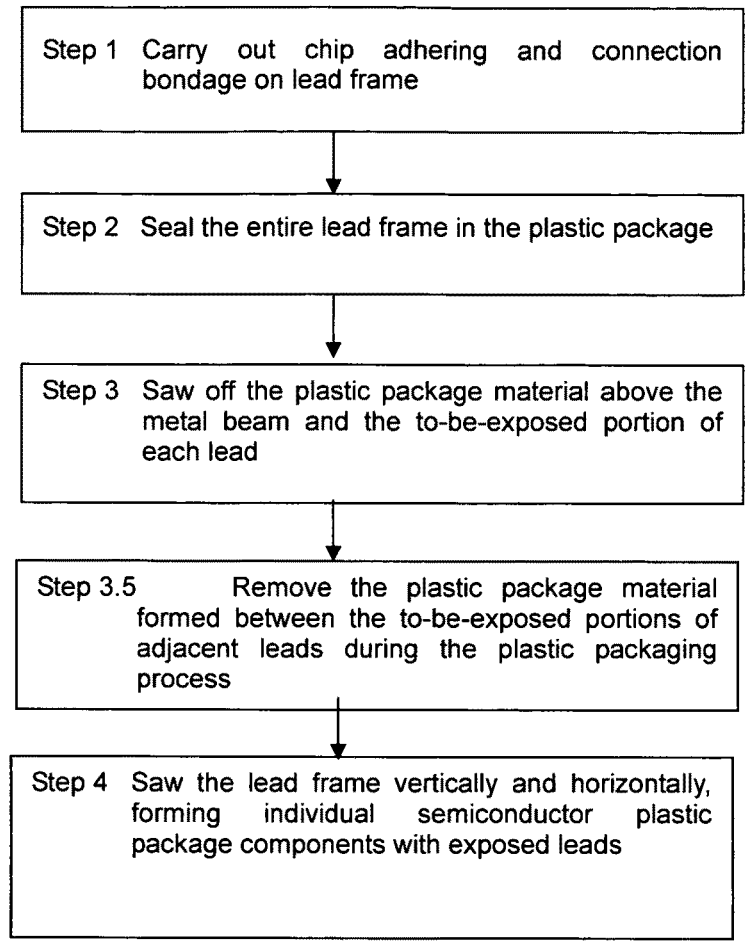
FIG. 4 is the flow chart of the first specific implementation example of the process for semiconductor packaging with external leads in this invention.

For the lead frame of above structure, as shown in FIG. 4, the packaging process provided in this implementation example includes the following steps:

Step 1 Chip adhering and connection bondage: as shown in FIG. 2B and FIG. 3B, for each lead frame unit 1 on the lead frame, a chip 13 is respectively adhered onto the die pad 11, then the chip 13 and leads 12 are connected and bonded using metal wire 14; wherein, the metal wire can be replaced by such metal connectors as metal plate or metal strip to realize the connection among chip 13 and leads 12.

Figure 2C:
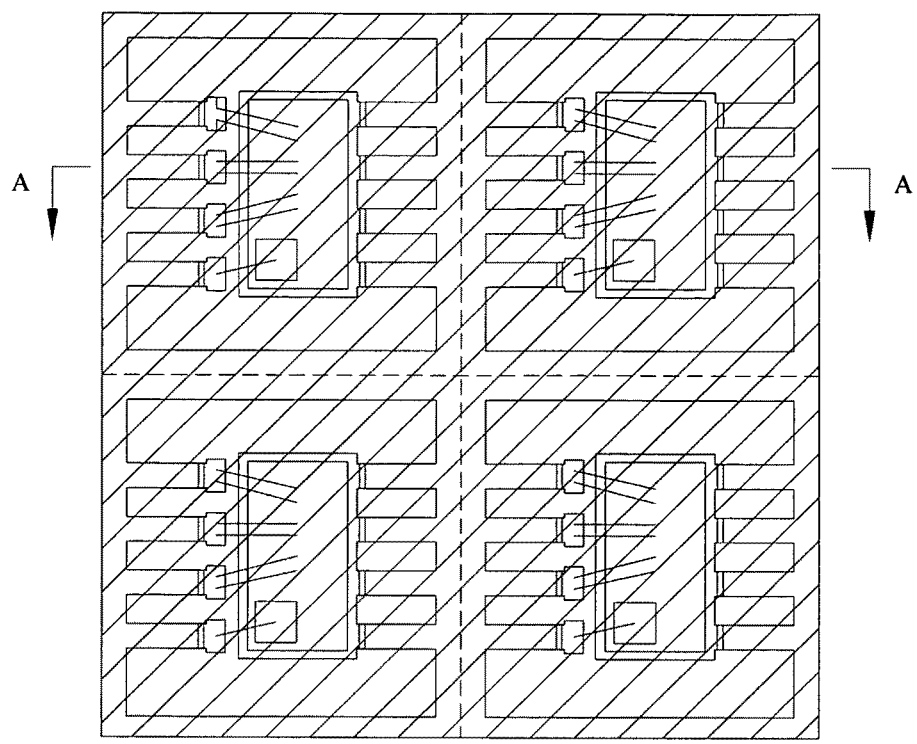
Figure 3C:
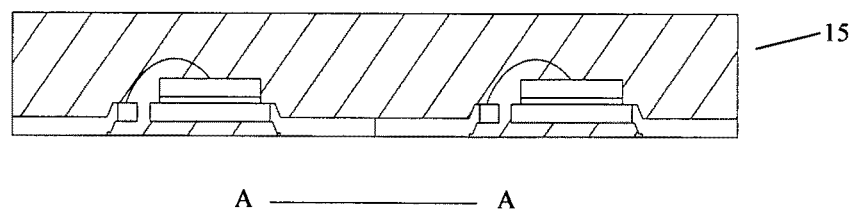

Step 2 Plastic packaging: as shown in FIG. 2C and FIG. 3C, plastic packaging of the entire lead frame is carried out, using a common packaging mould to seal all the lead frame units 1 (including chip 13, die pad 11 and lead 12) in the plastic package 15 forming a block. The lower surface of leads may be exposed at the bottom of plastic package.

Figure 2D:
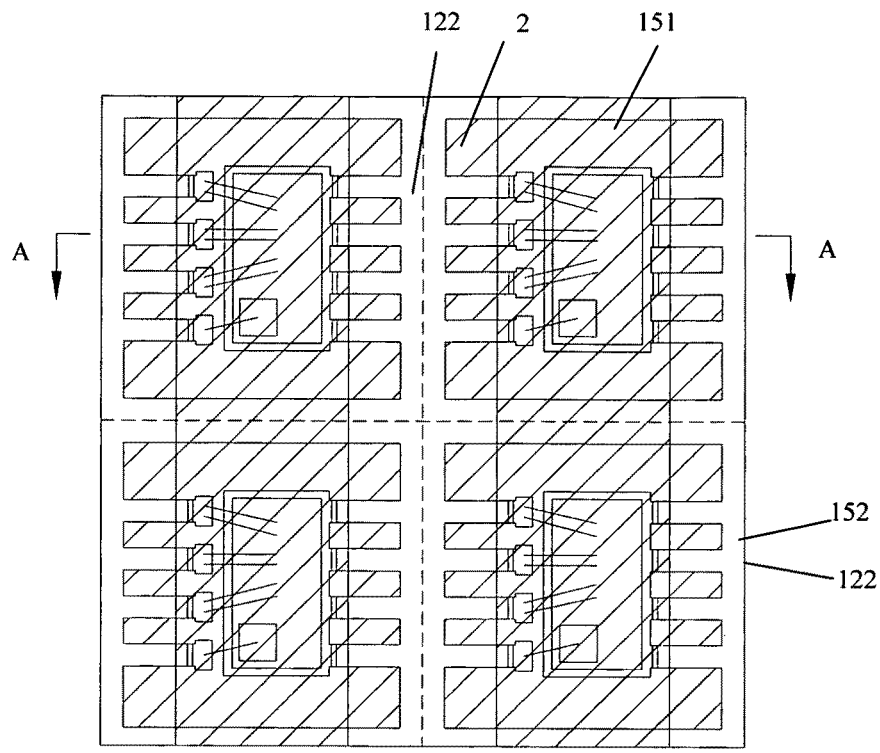
Figure 3D:
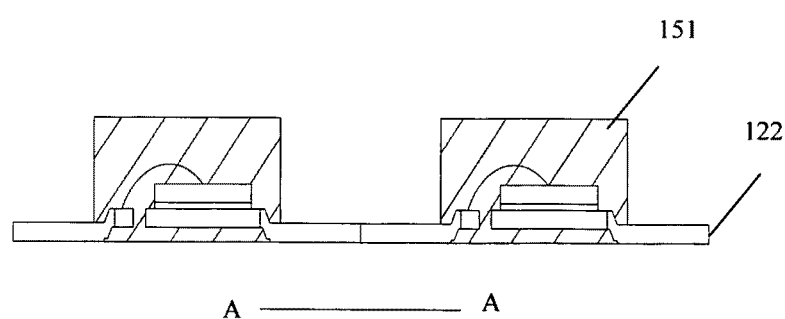

Step 3 Partial plastic molding material removal or first package sawing: remove the plastic package material above the metal beam 2 and the to-be-external portion 122 of each lead as shown in FIG. 2D and FIG. 3D. This can be carried out by using a first thick sawing tool to saw off the plastic package material above the metal beam 2 and the external lead portion 122 of each lead, forming several plastic package strips 151 separated by the metal beam 2; the specific sawing method is: saw the plastic package material vertically downward along the setting direction of the metal beam 2 from the top surface of the entire plastic package 15 saw into a depth until the upper surface of the lead portion 122 of the lead frame exposed. In the production process, it is possible to estimate the downward sawing thickness by subtracting the height of the lead frame from the height of the plastic package 15, and the required precision can be obtained in this sawing step by presetting the sawing tool with the sawing thickness.

In actual operation, in order to avoid insufficient saw off of the plastic package material, the estimated sawing thickness can be slightly increased to ensure that the sawing operation can be finished at once, and the surface of the entire metal beam 2 and that of each lead external portion 122 in each lead frame unit, which is connected with the metal beam 2, can be exposed. In this process, when sawing off the plastic package material above the lead frame, even an extremely small portion downward the surface of the lead frame is saw off due to the increase of sawing thickness, the entire packaging process will not be affected. On the contrary, if an extremely small portion of plastic package material above the lead frame is not saw off after this sawing operation, it will inevitably require this sawing step to be performed again to completely remove the remaining plastic package material, thus lengthening the cycle of the entire packaging process and reducing the production efficiency. Alternatively, the plastic package molding material can be removed by laser blasting or other suitable methods.

Figure 2E:
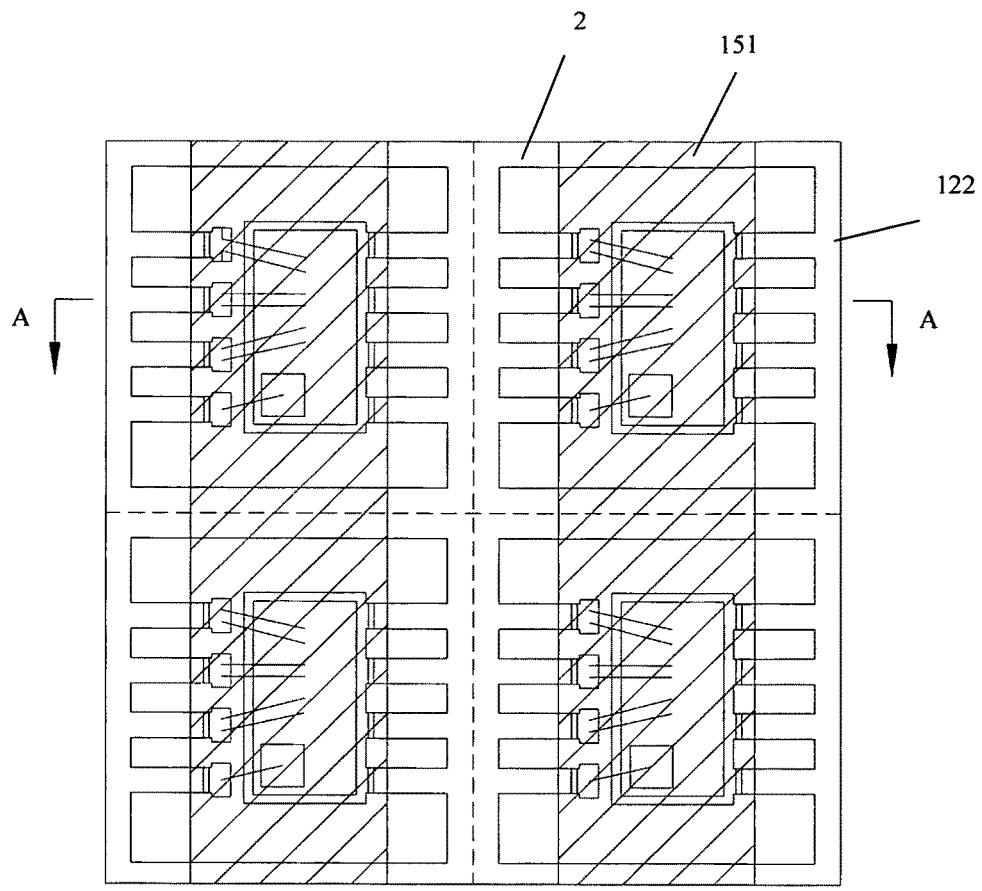
Figure 3E:
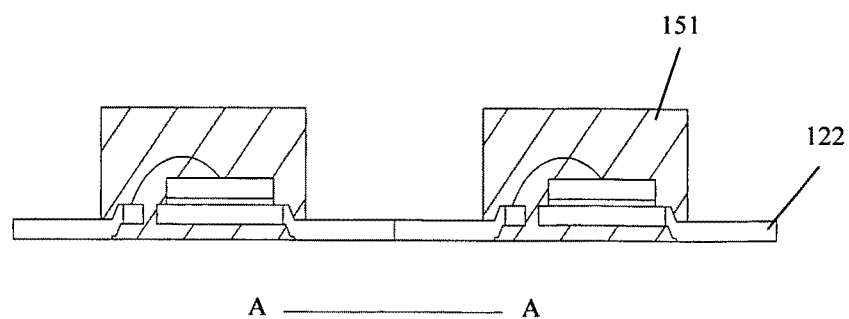

Step 3.5: The process may further include a step 3.5 to remove the left behind plastic package molding material 152 disposed within the space formed between the separated external portions 122 of adjacent leads after Step 3. The plastic package material 152 disposed between the external portions 122 of adjacent leads during the plastic packaging process may be removed through deflushing. In another implementation example of this invention, the plastic package material 152 between external portions 122 of the adjacent leads can also be removed by laser beam blasting. FIGS. 2E and 3E are the schematic diagrams after the plastic package material 152 is saw off with plastic package material between the external portions 122 of adjacent leads removed.

Figure 2F:
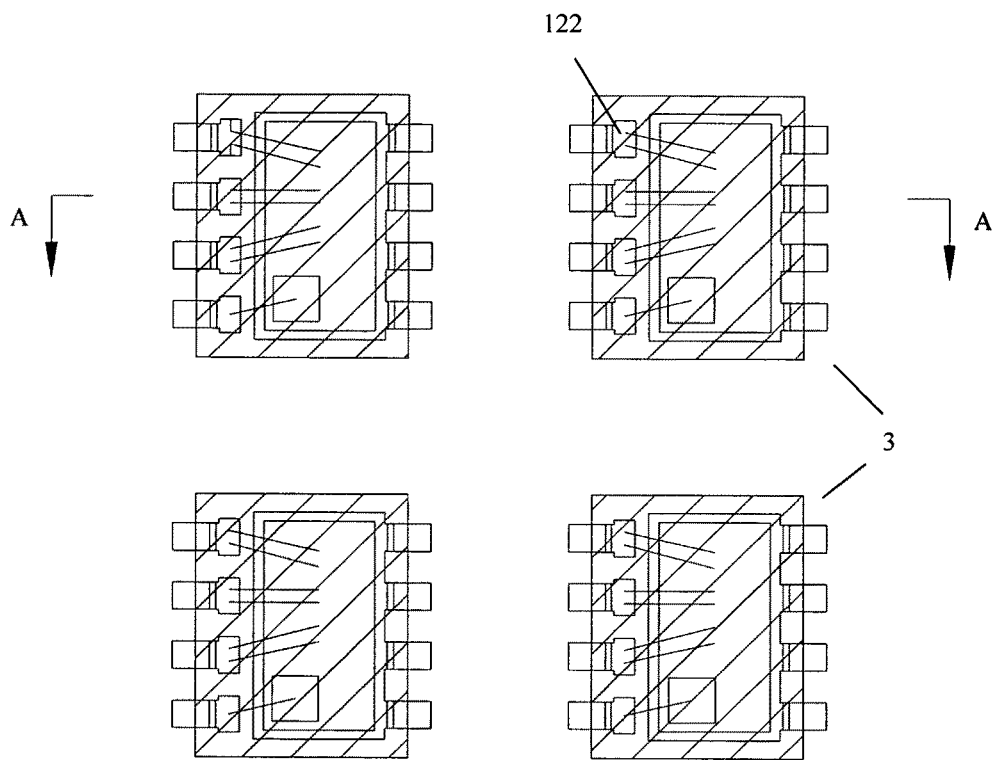
Figure 3F:
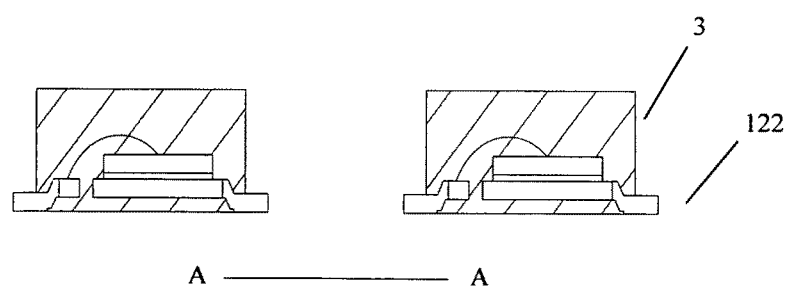

Step 4 Second package sawing: use a second thin sawing tool to saw the entire lead frame horizontally and vertically, then separate each lead frame unit 1, forming a plurality of individual semiconductor plastic package components 3 with external leads (as shown in FIG. 2F and FIG. 3F); The specific procedure is as follows: Step 4.1. Beam sawing: vertically saw off the metal beam 2 between adjacent plastic package strips 151, separate the connection among the leads 12 of each lead frame unit, and keep the external portion 122 of each lead; Step 4.2. Sawing: horizontally saw through between the lead frame units of plastic package strips 151, and separate to form a plurality of individual semiconductor components 3 with external leads.

In another implementation example of this invention, the horizontal sawing can be done before vertical beam sawing in Step 4, i.e.: Step 4.1 Sawing: saw among the lead frame units of plastic package strips 151; Step 4.2. Beam sawing: vertically saw off the metal beam 2 between adjacent lead frame units, separate the connection among the leads 12 of each lead frame unit, and keep the external portion 122 of each lead, forming a plurality of individual semiconductor components 3 with external leads.

Implementation Example 2

FIGS. 5A~7 show a specific implementation example of the process for semiconductor packaging with external leads provided in this invention, which forms semiconductor components with external leads for lead frames with the following structural characteristics.

Figure 5A:
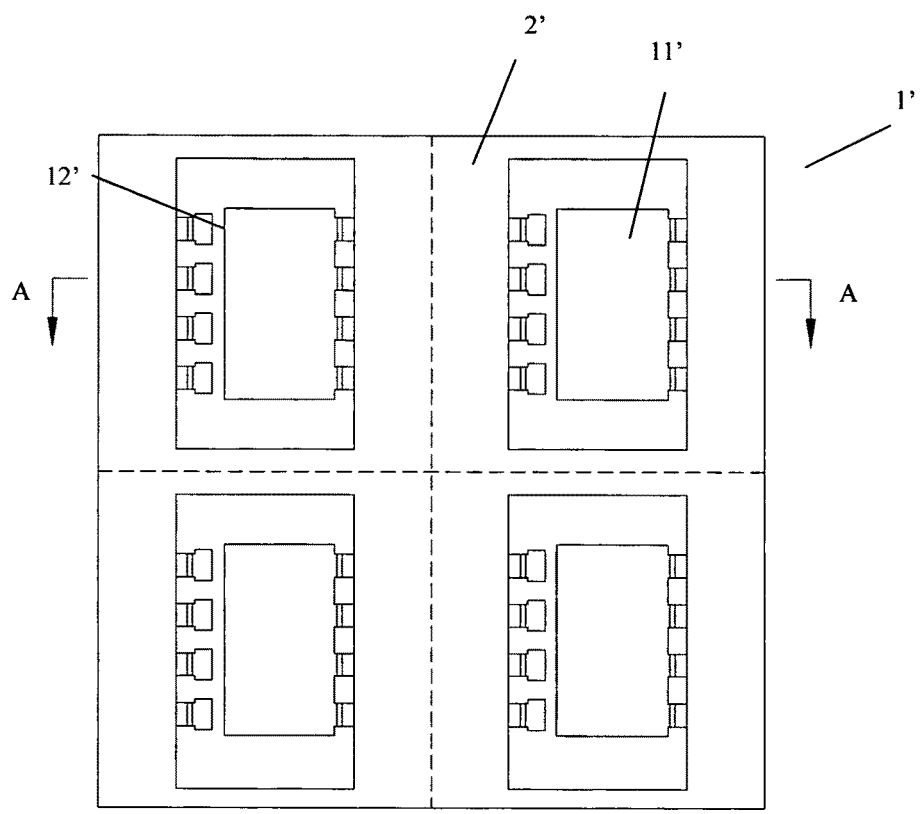
FIGS. 5A~5F is the top view or bottom view of each step in the second specific implementation example of the process for semiconductor packaging with external leads in this invention.
Figure 6A:
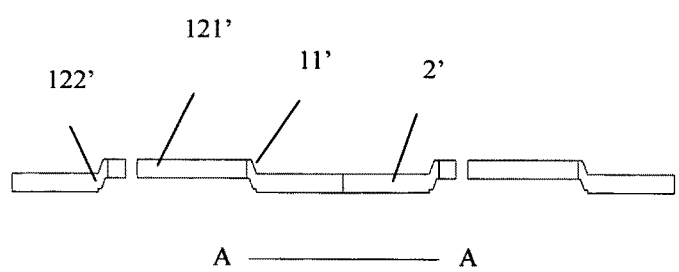
FIGS. 6A~6F is the cross sectional view of each step in the second specific implementation example of the process for semiconductor packaging with external leads in this invention.

As shown in FIG. 5A and FIG. 6A, the said lead frame contains a plurality of distributed lead frame units 1', and metal beams 2' for connecting the lead frame units. In order to clearly and concisely show the structure of the lead frame, the lead frame containing 4 lead frame units (surrounded by broken lines in FIG. 5A) is taken as an example in this implementation example. Wherein, each lead frame unit 1' contains a die pad 11', and a plurality of leads 12' on both sides of the die pad 11'; each lead contains an internal portion 121' sealed inside the plastic package and an external portion 122' outside the plastic package, and the external portions 122' of adjacent leads are fused together. Furthermore, the adjacent lead frame units 1' are connected by connecting the external portion 122' of each lead 12' to the metal beams 2'. The difference of lead frames in Implementation Example 2 from Implementation Example 1 is that external portions 122' of adjacent leads are fused together without space in between and connected to the metal beam 2' making metal beams 2' seem wider.

Figure 5B:
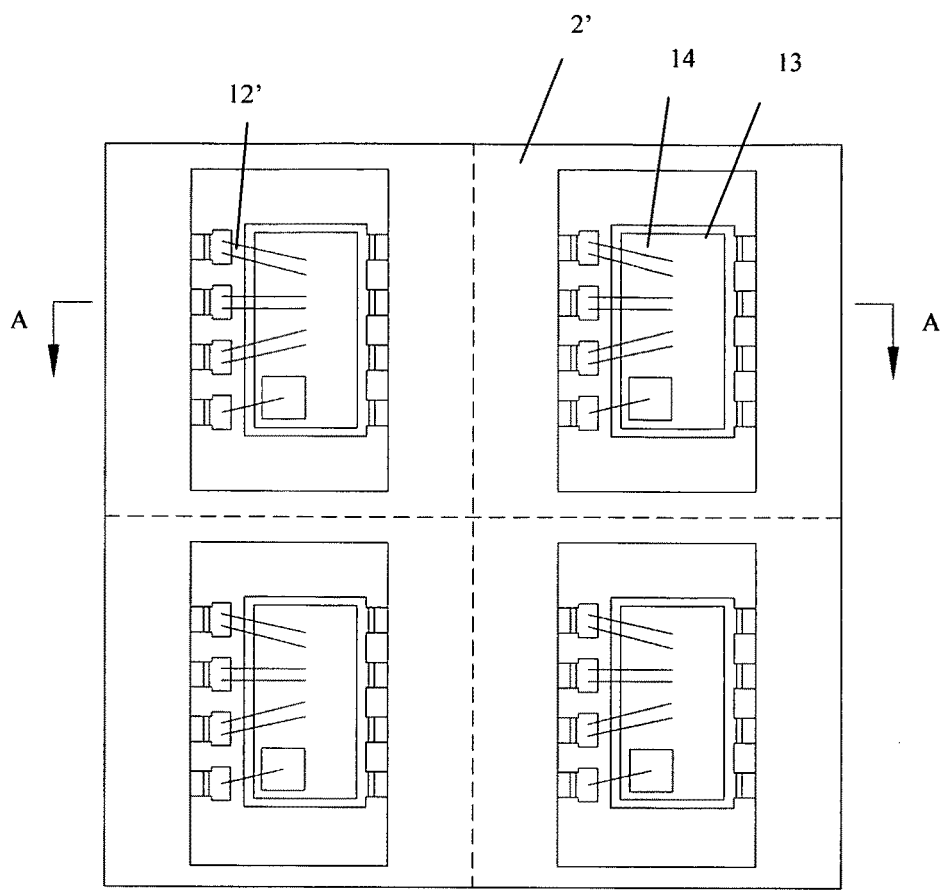
Figure 6B:
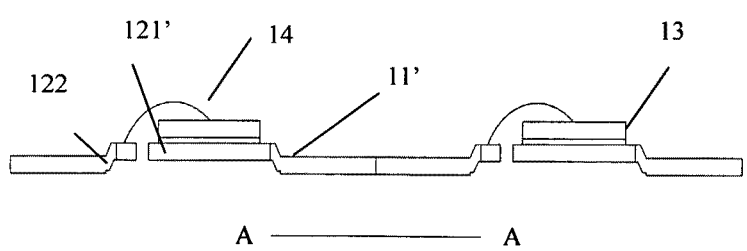
Figure 7:
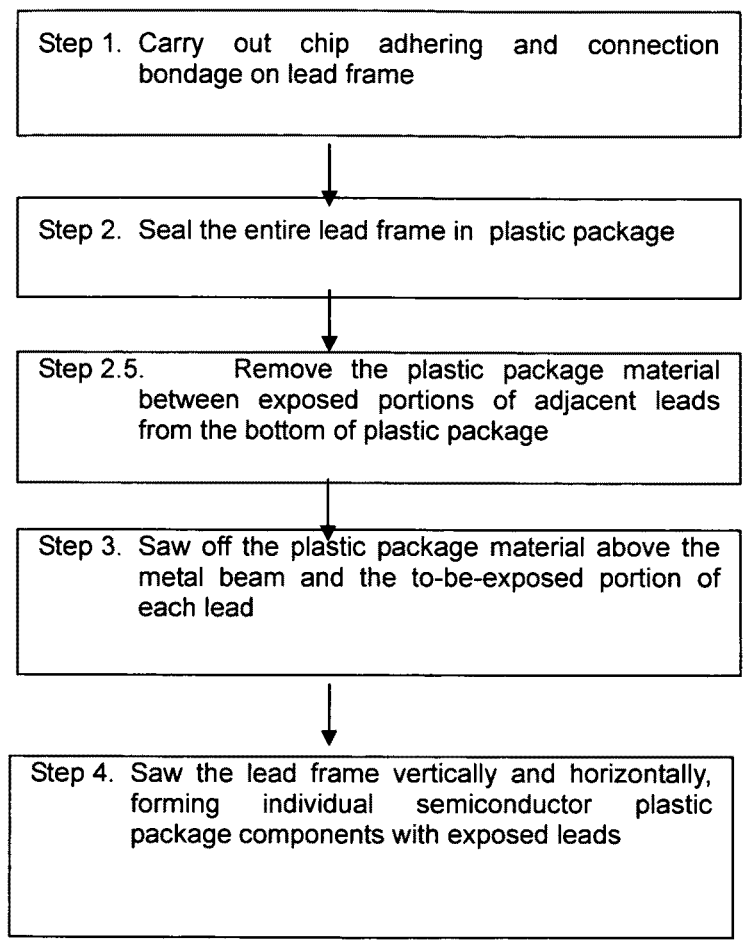
FIG. 7 is the flow chart of the second specific implementation example of the process for semiconductor packaging with external leads in this invention.

For the lead frame of above structure, as shown in FIG. 7, the packaging process provided in this implementation example includes the following steps:

Step 1 Chip adhering and connection bondage: as shown in FIG. 5B and FIG. 6B, for each lead frame unit 1' on the lead frame, a chip 13 is respectively adhered onto the die pad 11', then the chip 13 and lead 12' are connected and bonded using metal wire 14; wherein, the metal wire can be replaced by such metal connectors as metal plate or metal strip to realize the connection among chip 13 and leads 12'.

Figure 5C:
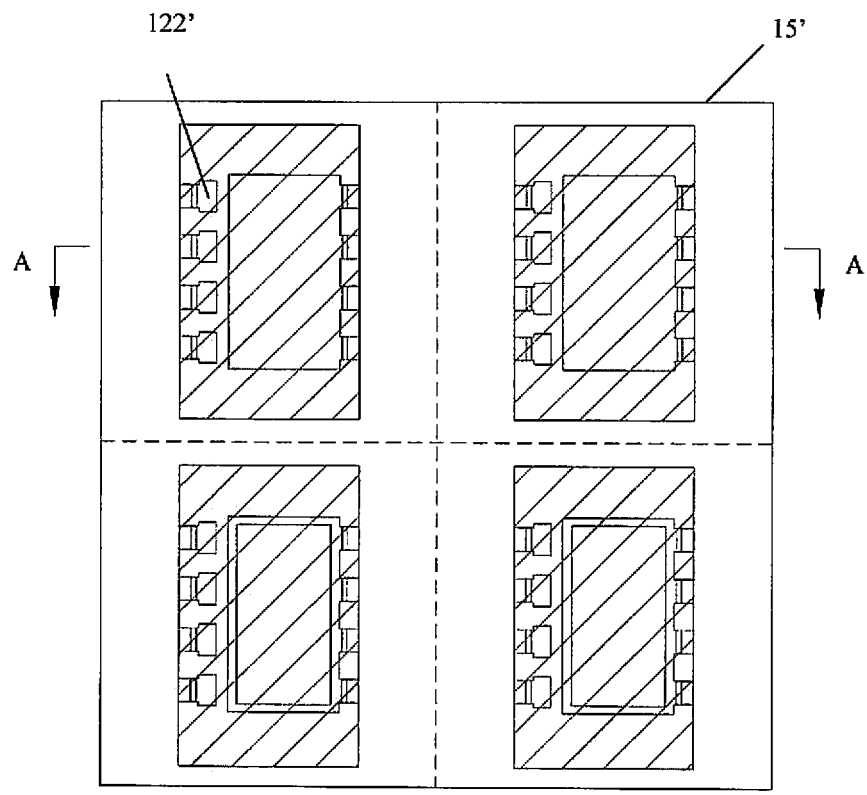
Figure 6C:
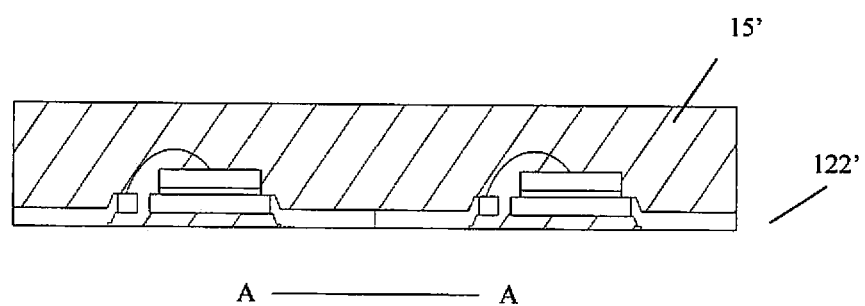

Step 2 Plastic packaging: as shown in FIG. 5C and FIG. 6C, plastic packaging of the entire lead frame is carried out, using a common packaging mould to seal all the lead frame units 1' (including chip 13, die pad 11' and leads 12') in the plastic package 15'. The lower surface of leads may be exposed at the bottom of plastic package, in which FIG. 5C is the schematic diagram of the bottom of plastic package after sealing.

Figure 5D:
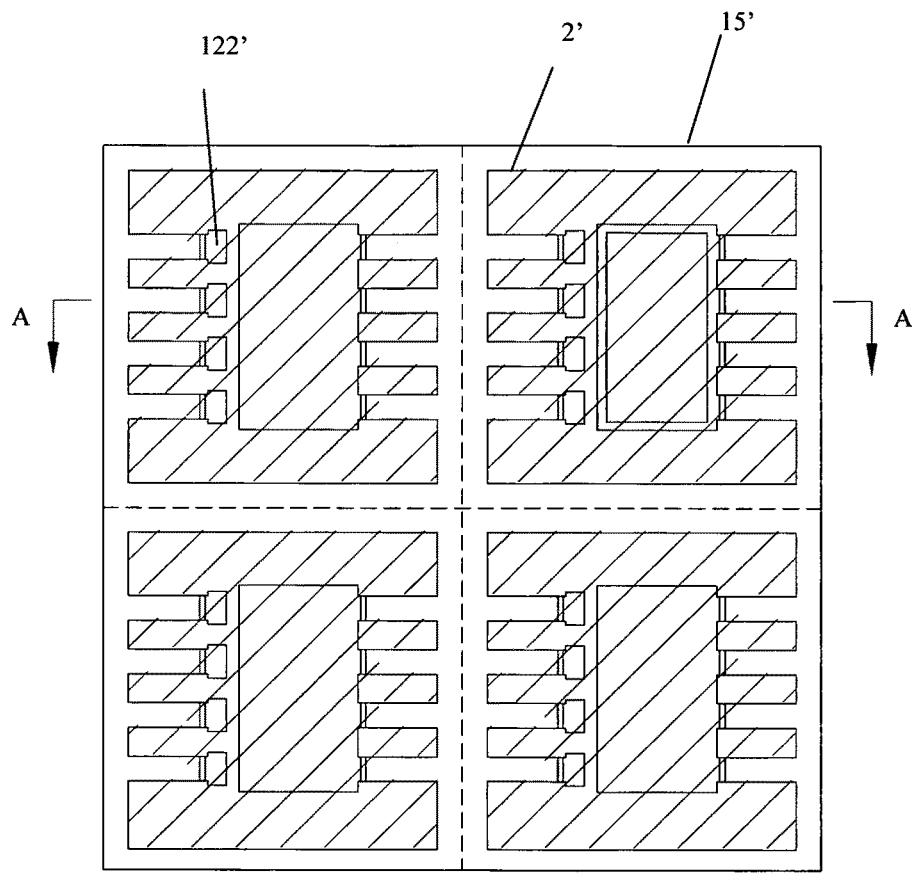
Figure 6D:
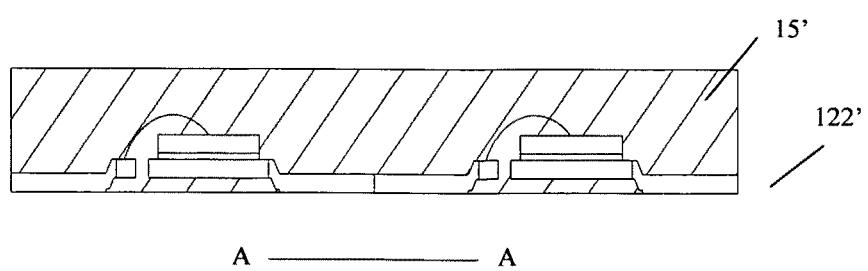

Step 2.5 The process may further include a step 2.5 after Step 2 to remove the metal portion between external portions of adjacent leads: the bottom of sealed plastic package 15' can be etched with a mask to remove the metal between external portions of adjacent leads. In another better implementation example of this invention, the metal between external portions 122' of adjacent leads at the bottom of plastic package 15 can also be removed by laser cutting. As shown in FIG. 5D and FIG. 6D, wherein FIG. 5D is the projection view of the bottom face, showing the schematic diagram after the metal between the external portions 122' of adjacent leads is removed, when there is no substance among the external portions 122' of adjacent leads, the plastic package material above the lead is visible through the hole opened up by the removal of the metal between the external leads 122' of adjacent leads from the bottom view in FIG. 5D. The metal beams 2' become narrower.

Figure 5E:
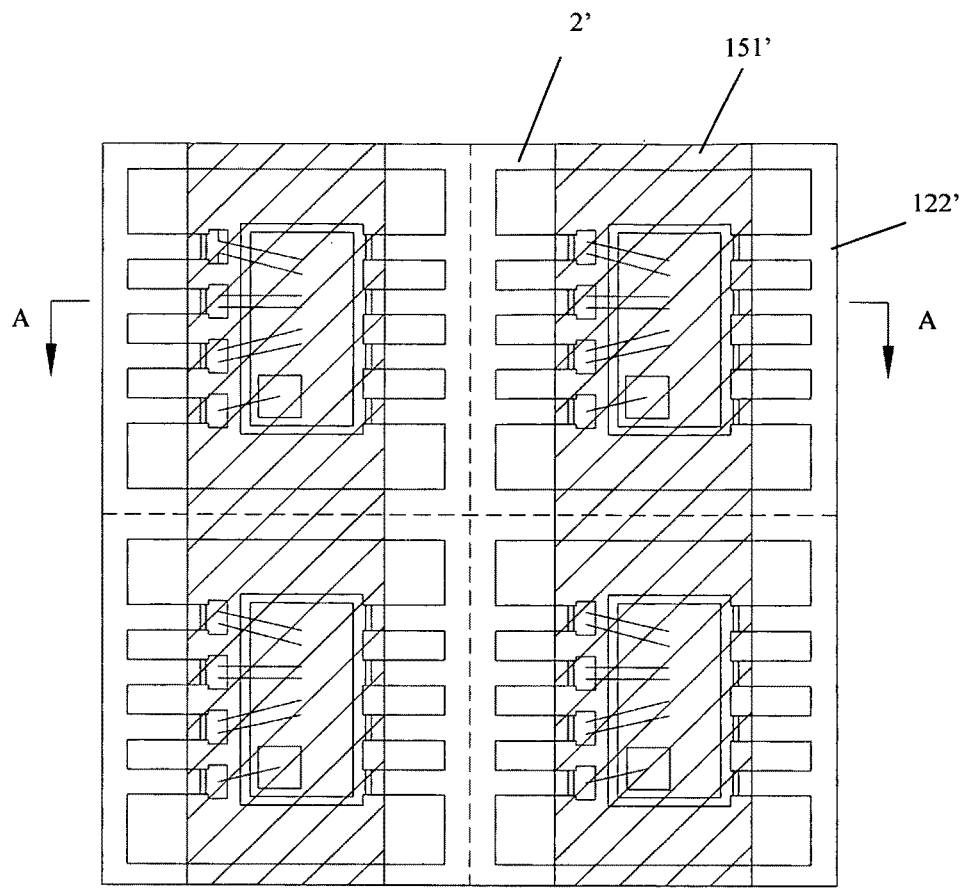
Figure 6E:
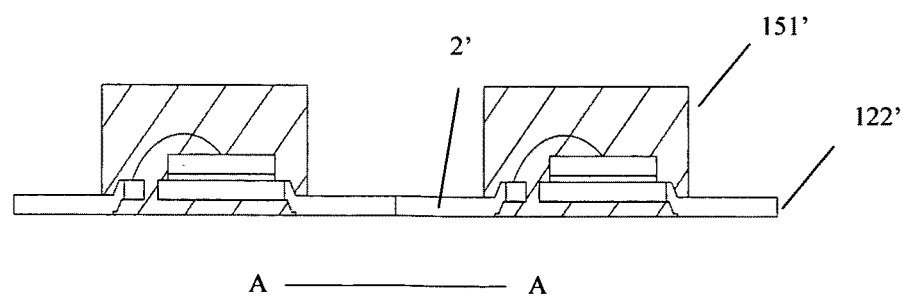

Step 3 Partial plastic molding material removal or first package sawing: remove the plastic package material above the metal beam 2' and the to-be-external portion 122' of each lead as shown in FIG. 5E and FIG. 6E. This can be carried out by using a first thick sawing tool to remove the plastic package material above the metal beam 2' and the to-be-external portion 122' of each lead, forming a plurality of plastic package strips 151' separated by the metal beam 2'; the specific sawing method is: saw the plastic package material vertically downward along the setting direction of the metal beam 2' from the top surface of the entire plastic package 15', and saw to a depth until the upper surface of the lead external portion 122' of the lead frame. In the production process, it is possible to estimate the downward sawing thickness by subtracting the height of the lead frame from the height of the plastic package 15', and the required precision can be obtained in this sawing step by presetting the sawing tool with the sawing thickness.

In actual operation of this step, as consistent with implementation example 1', in order to avoid insufficient saw off of the plastic package material, the estimated sawing thickness can be slightly increased to ensure that the sawing operation can be finished at once, and the surface of the entire metal beam 2' and that of each lead external portion 122' in each lead frame unit, which is connected with the metal beam 2', can be external, thus effectively improving the sawing quality and packaging efficiency. Alternatively the plastic package molding material can be removed by laser blasting or other suitable methods.

Figure 5F:
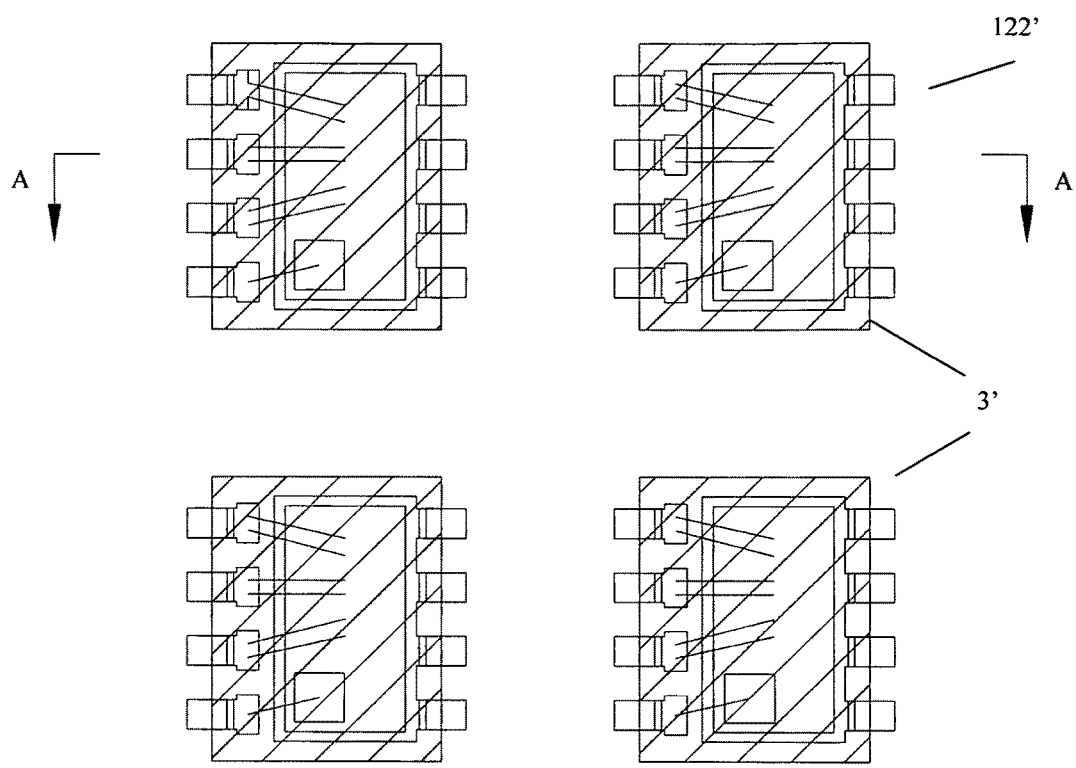
Figure 6F:
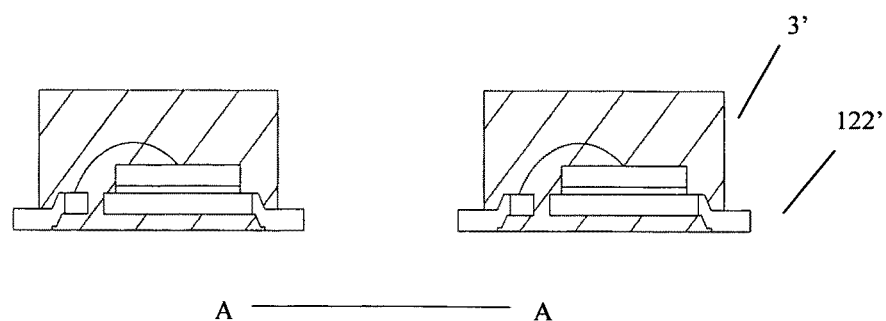

Step 4 Second package sawing: use a thin sawing tool to saw the entire lead frame horizontally and vertically, then separate each lead frame unit 1', forming individual semiconductor plastic package components 3' with external leads (as shown in FIG. 5F and FIG. 6F); The specific procedure is as follows: Step 4.1. Beam sawing: vertically saw off the metal beam 2' between adjacent plastic package strips 151', separate the connection among the leads 12' of each lead frame unit, and keep the external portion 122' of each lead; Step 4.2. Sawing: horizontally saw through between the lead frame units of plastic package strips 151', and separate to form a plurality of individual semiconductor components 3' with external leads.

In another implementation example of this invention, the horizontal sawing can be done before vertical beam sawing in Step 4, i.e.: Step 4.1 Sawing: horizontally saw between the lead frame units of plastic package strips 151' across the metal beams with sections of metal beams connecting a plurality of lead frame units; Step 4.2 Beam sawing: vertically saw off the metal beam 2' sections between adjacent lead frame units, separate the connection among the leads 12' of each lead frame unit, and keep the external portion 122' of each lead, forming a plurality of individual semiconductor components 3' with external leads.

The processing moulds and mechanical tools utilized in the process for semiconductor packaging with external leads as provided in this invention are applicable to different lead-exposed semiconductor package types and processes, without additional design and manufacturing of particular operating tools including moulds, thus effectively improving plastic packaging efficiency and reducing manufacturing cost.

Although the detailed contents of this invention have been introduced through the above selected implementation examples, it should be noted that the above description shall not be deemed as limitation on this invention. After technical personnel in this field have read the above contents, multiple modifications and substitutions to this invention will be self-evident. Therefore, the protection scope of this invention shall be limited by the attached claims.

We claim:

1. A process for packaging semiconductor device with external leads comprises:
    Step 1: providing a lead frame comprising a plurality of lead frame units connected by a plurality of metal beams, each lead frame unit comprising a die pad and a plurality of leads extending away from the die pad; adhering a semiconductor chip onto each of the die pad, and providing a plurality of metal connections for electrically connecting each chip to its corresponding leads;
    Step 2 applying a plastic molding material to enclose the plurality of the lead frame units, the metal beams, the chips, and portions of the metal connections;
    Step 3 removing a portion of the plastic molding material above the metal beams to expose the metal beams and portions of the leads extending away from the die pad electrically connected to the semiconductor chip and disposed near-the metal beams on a top surface of the leadframe;
    Step 4 separating the lead frame units along the metal beams into a plurality of individual semiconductor plastic package components each encloses one of the lead frame units with the portions of the leads exposed functioning as external leads.

2. The semiconductor packaging process of claim 1 wherein the Step 2 further comprises a step of applying the plastic molding material to cover and enclose the entire lead frame into a plastic molding block.

3. The semiconductor packaging process of claim 2 wherein the process of removing a portion of the plastic molding material above the metal beams comprises a step of vertically sawing the plastic package material along the metal beam from the top surface of the plastic molding block to the top surface of the portions of leads for exposing portions of the lead frame.

4. The semiconductor packaging process of claim 1 wherein the step of removing a portion of the plastic molding material is carried out by applying a first sawing tool with a first sawing width.

5. The semiconductor packaging process of claim 4 wherein the step of separating the lead frame units is carried out by further applying a second sawing tool with a second sawing width after applying the first sawing tool.

6. The semiconductor packaging process of claim 5 wherein the step of applying the second sawing tool further comprises a step of applying the second sawing tool with the second sawing width narrower than the first sawing width.

7. The semiconductor packaging process of claim 6 wherein the step of applying the second sawing tool further comprises a step of applying the second sawing tool with the second sawing width wider than a width of the metal beams.

8. The semiconductor packaging process of claim 1 wherein the step of disposing a plurality of leads extending away the die pads further comprising a step of arranging at least one of the plurality of leads with an internal lead portion and an external lead portion.

9. The semiconductor packaging process of claim 8 wherein the external lead portions of each adjacent leads are separated.

10. The semiconductor packaging process of claim 9 further comprises a step of removing bottom portions of plastic molding material between external portions of adjacent leads.

11. The semiconductor packaging process of claim 10 wherein the step of removing bottom portions of plastic molding material between external portions of adjacent leads is carried out by deflash.

12. The semiconductor packaging process of claim 10 wherein the step of removing bottom portions of plastic molding material between external portions of adjacent leads is carried out by laser blasting.

13. The semiconductor packaging process of claim 8 wherein the step of disposing the plurality of leads to extend away from the die pad further comprising a step of fusing the external lead portions of at least two adjacent leads together.

14. he semiconductor packaging process of claim 8 wherein the step of disposing the plurality of leads to extend away from the die pad further comprises a step of removing a portion of metal between and fusing together the external lead portions of at least two adjacent leads.

15. The semiconductor packaging process of claim 14 wherein the step of removing the portion of metal between external portions of adjacent leads further comprises a step of applying a chemical etching to remove the portion of metal between the adjacent external lead potions.

16. The semiconductor packaging process of claim 1 wherein the step of applying a plastic molding material to enclose the plurality of the lead frame units comprises a step of partially exposing a bottom surface of at least one of the lead frame units.

17. The semiconductor packaging process of claim 1 wherein the step of applying a plastic molding material to enclose the plurality of the lead frame units comprises a step of partially exposing a bottom surface of at least one of the metal beams.

18. The semiconductor packaging process of claim 1 wherein the step of removing the portion of the plastic molding material above the metal beams further comprises a step of forming a plurality of molding material strips separated by the metal beams before removing the portion of the plastic molding material above the metal beams.

19. The semiconductor packaging process of claim 1 wherein Step 4 further comprises the following steps :
Step 4.1 sawing off the metal beams between adjacent plastic mold strips to separate the connection between the leads of each lead frame unit and to keep the external portion of each lead;
Step 4.2 sawing between the lead frame units of plastic package strips, to separate and form a plurality of individual semiconductor components with external leads.

20. The semiconductor packaging process of claim 1 wherein Step 4 further comprises the following steps:
Step 4.1 sawing between the lead frame units along the metal beams to expose the metal beams connected between the lead frame units;
Step 4.2 sawing off the metal beams between adjacent lead frame units to separate the lead frame units.

* * * * *